US012677534B2

(12) United States Patent
Yang et al.

(10) Patent No.: US 12,677,534 B2
(45) Date of Patent: Jul. 7, 2026

(54) DISPLAY APPARATUS AND METHOD OF MANUFACTURING THE SAME

(71) Applicant: Samsung Display Co., Ltd., Yongin-si (KR)

(72) Inventors: Shinhyuk Yang, Yongin-si (KR); Jeehoon Kim, Yongin-si (KR); Donghan Kang, Yongin-si (KR); Junki Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 630 days.

(21) Appl. No.: 18/153,968

(22) Filed: Jan. 12, 2023

(65) Prior Publication Data

US 2023/0240095 A1 Jul. 27, 2023

(30) Foreign Application Priority Data

Jan. 26, 2022 (KR) ........................ 10-2022-0011785

(51) Int. Cl.
*H10K 59/12* (2023.01)
*H10K 59/131* (2023.01)

(52) U.S. Cl.
CPC ....... *H10K 59/1201* (2023.02); *H10K 59/131* (2023.02)

(58) Field of Classification Search
CPC .................................................. H10K 59/1201
See application file for complete search history.

(56) References Cited

U.S. PATENT DOCUMENTS

| | | | |
|---|---|---|---|
| 7,468,527 B2 | 12/2008 | Ahn | |
| 9,236,581 B2 | 1/2016 | Kato et al. | |
| 2014/0346458 A1* | 11/2014 | Park | H10D 86/60 |
| | | | 257/40 |
| 2017/0345882 A1* | 11/2017 | Nam | H10K 71/166 |
| 2020/0395428 A1 | 12/2020 | Baek et al. | |

FOREIGN PATENT DOCUMENTS

| | | |
|---|---|---|
| JP | 6136578 B2 | 5/2017 |
| JP | 6451897 B1 | 1/2019 |
| KR | 2002-0015237 A | 2/2002 |
| KR | 10-2020-0039264 A | 4/2020 |
| KR | 10-2020-0049223 A | 5/2020 |
| KR | 10-2020-0143563 A | 12/2020 |
| KR | 10-2285034 B1 | 8/2021 |

* cited by examiner

*Primary Examiner* — Douglas M Menz
(74) *Attorney, Agent, or Firm* — Womble Bond Dickinson (US) LLP

(57) ABSTRACT

A display apparatus includes: a substrate including a display area, and a peripheral area outside the display area; a display element at the display area; and a pad at the peripheral area, the pad including: a first metal layer; a second metal layer on the first metal layer; a first metal oxide layer on the second metal layer, and in surface-contact with the second metal layer; and an oxide conductive layer on the first metal oxide layer, and in surface-contact with the first metal oxide layer.

20 Claims, 14 Drawing Sheets

FIG. 1

DISPLAY APPARATUS AND METHOD OF MANUFACTURING THE SAME

CROSS-REFERENCE TO RELATED APPLICATION

This application claims priority to and the benefit of Korean Patent Application No. 10-2022-0011785, filed on Jan. 26, 2022, in the Korean Intellectual Property Office, the entire disclosure of which is incorporated by reference herein.

BACKGROUND

1. Field

One or more embodiments of the present disclosure relate to a display apparatus and a method of manufacturing the display apparatus.

2. Description of the Related Art

In general, a display apparatus, such as an organic light-emitting display apparatus, includes a pixel electrode, an emission layer, and an opposite electrode. Light emitted from the emission layer is extracted outside to display images. A display apparatus emits light having a luminance that corresponds to an electrical signal applied to the pixel electrode. The display apparatus may include a pad, and may receive a signal from an integrated circuit device and/or a printed circuit board via the pad.

The above information disclosed in this Background section is for enhancement of understanding of the background of the present disclosure, and therefore, it may contain information that does not constitute prior art.

SUMMARY

In a display apparatus according to a comparative example, a pad may be damaged in post-processes after forming the pad.

One or more embodiments of the present disclosure are directed to a display apparatus having a low defective rate during manufacturing processes, and a method of manufacturing the display apparatus.

However, the aspects and features of the present disclosure are not limited to those described above, and additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including a display area, and a peripheral area outside the display area; a display element at the display area; and a pad at the peripheral area, the pad including: a first metal layer; a second metal layer on the first metal layer; a first metal oxide layer on the second metal layer, and in surface-contact with the second metal layer; and an oxide conductive layer on the first metal oxide layer, and in surface-contact with the first metal oxide layer.

In an embodiment, the oxide conductive layer may include indium tin oxide (ITO).

In an embodiment, the oxide conductive layer may include amorphous ITO.

In an embodiment, the first metal oxide layer may include an oxide of a metal included in the second metal layer.

In an embodiment, a bottom surface of the oxide conductive layer facing the first metal oxide layer may have an area that is less than an area of an upper surface of the oxide conductive layer, and a side surface of the oxide conductive layer may be inclined with respect to an upper surface of the first metal oxide layer.

In an embodiment, an area of the upper surface of the first metal oxide layer may be equal to the area of the bottom surface of the oxide conductive layer.

In an embodiment, the display apparatus may further include a second metal oxide layer on the second metal layer and located outside the first metal oxide layer.

In an embodiment, the first metal oxide layer and the second metal oxide layer may be integrally formed as a single body.

In an embodiment, the first metal oxide layer may have a thickness that is greater than a thickness of the second metal oxide layer.

In an embodiment, the first metal oxide layer and the second metal oxide layer may include a same material as each other.

In an embodiment, the first metal oxide layer and the second metal oxide layer may include an oxide of a metal included in the second metal layer.

In an embodiment, the second metal layer may include copper, and the first metal oxide layer and the second metal oxide layer may include copper oxide.

In an embodiment, the area of the upper surface of the oxide conductive layer may be equal to or less than an area of an upper surface of the second metal layer.

In an embodiment, an angle between the bottom surface and the side surface of the oxide conductive layer may be larger than 90° and less than or equal to 170°.

In an embodiment, the first metal layer may include titanium.

In an embodiment, the oxide conductive layer may have a thickness of about 400 Å to about 850 Å.

In an embodiment, an area of a bottom surface of the second metal layer may be greater than an area of an upper surface of the second metal layer, and a side surface of the second metal layer may be inclined with respect to the bottom surface of the second metal layer.

In an embodiment, an angle between the bottom surface and the side surface of the second metal layer may be about 30° to about 70°.

In an embodiment, the display apparatus may further include a thin film transistor at the display area, and electrically connected to the display element, the thin film transistor including an electrode having a layered structure that is the same as a layered structure of the pad.

According to one or more embodiments of the present disclosure, a method of manufacturing a display apparatus includes: depositing a first metal layer forming layer on a substrate in a first chamber of a first deposition cluster; depositing a second metal layer forming layer on the first metal layer forming layer in a second chamber of the first deposition cluster; cleaning an upper surface of the second metal layer forming layer outside of the first deposition cluster; depositing an oxide conductive layer forming layer over the second metal layer forming layer in a third chamber; and forming a pad by concurrently patterning the first metal layer forming layer, the second metal layer forming layer, and the oxide conductive layer forming layer.

In an embodiment, the forming of the pad may include: concurrently patterning, in a first patterning process, the first metal layer forming layer, the second metal layer forming layer, and the oxide conductive layer forming layer; and forming, in a second patterning process, an oxide conductive layer by patterning the oxide conductive layer forming layer.

In an embodiment, a weight percent (wt %) of a metal inhibitor included in an etchant used in the second patterning process may be greater than a wt % of a metal inhibitor included in an etchant used in the first patterning process.

In an embodiment: the first metal layer forming layer may include titanium; the second metal layer forming layer may include copper; and the oxide conductive layer forming layer may include indium tin oxide (ITO).

The above and other aspects and features of the present disclosure will become better understood through the accompanying drawings, the detailed description, and the claims.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 1 is a schematic plan view of a display apparatus according to an embodiment;

DETAILED DESCRIPTION

Figure 2:
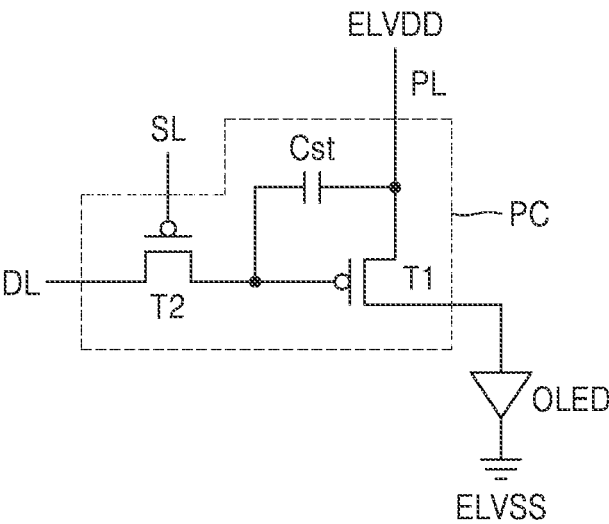
FIG. 2 is an equivalent circuit diagram of a pixel included in the display apparatus of FIG. 1.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
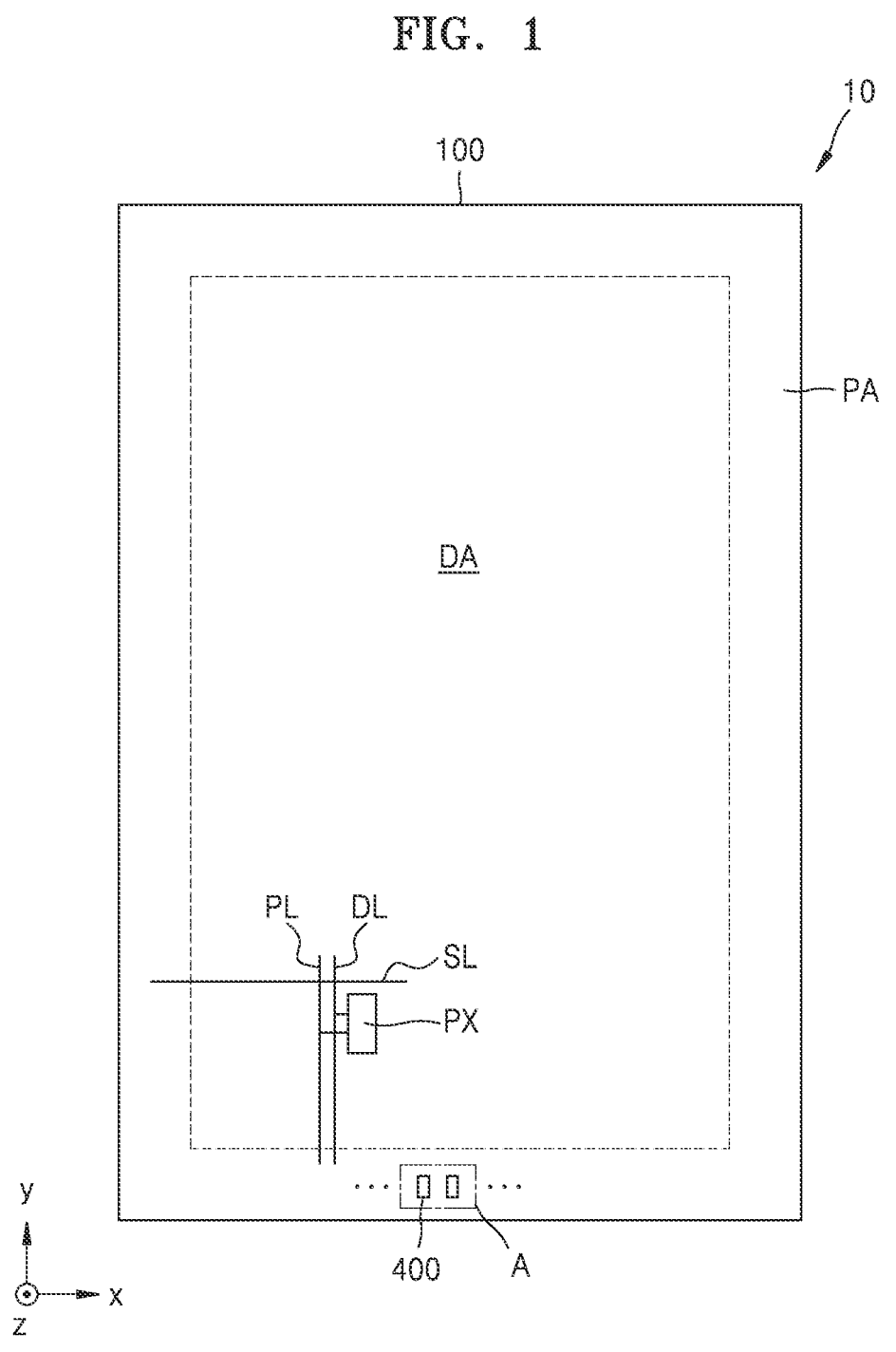

FIG. 1 is a schematic plan view of a display apparatus according to an embodiment.

As shown in FIG. 1, a display apparatus according to an embodiment includes a display panel 10. Any suitable kind of display apparatus may be used, provided that the display apparatus includes the display panel 10. For example, the display apparatus may denote various suitable devices, such as a smartphone, a tablet, a laptop computer, a television, a billboard, and the like.

The display panel 10 includes a display area DA, and a peripheral area PA located at (e.g., in or on) an outer portion of the display area DA. In FIG. 1, the display area DA has a rectangular shape (e.g., in a plan view). However, the present disclosure is not limited thereto. The display area DA may have various suitable shapes other than the rectangular shape, for example, such as a circular shape, an elliptical shape, a polygonal shape, a certain figure shape, and the like.

The display area DA displays images, and may include a plurality of pixels PX. Each of the pixels PX may include a display element, such as an organic light-emitting diode. Each pixel PX may emit, for example, red, green, or blue light. The pixel PX may be connected to a pixel circuit including a thin film transistor TFT (e.g., see FIG. 4), a storage capacitor, and the like. The pixel circuit may be connected to a scan line SL configured to transfer a scan signal, a data line DL that crosses the scan line SL and configured to transfer a data signal, a driving voltage line PL configured to supply a driving voltage, and/or the like. The scan line SL may extend in an x direction, and the data line DL and the driving voltage line PL may extend in a y direction.

The pixel PX may emit light having a desired luminance corresponding to an electrical signal from the pixel circuit thereof. The display area DA may display a desired image via the light emitted from the pixels PX. The pixel PX may be defined as an emission region for emitting light of one of red, green, or blue colors, as described above.

The peripheral area PA may be a region where the pixels PX are not arranged, and may not display images. A power supply line and/or the like for driving the pixels PX may be at (e.g., in or on) the peripheral area PA. Also, the peripheral area PA may include pads 400 to which a printed circuit board including a driving circuit portion or an integrated circuit element such as a driver IC is electrically connected.

The display panel 10 includes a substrate 100, and thus, it may be understood that the substrate 100 includes the display area DA and the peripheral area PA.

Hereinafter, a display apparatus according to an embodiment is described as an organic light-emitting display apparatus as an example. However, the display apparatus of the present disclosure is not limited thereto. For example, the display apparatus may include an inorganic light-emitting display apparatus, an inorganic electroluminescence (EL) display apparatus, or a quantum dot light-emitting display apparatus.

FIG. 2 is an equivalent circuit diagram of a pixel PX included in the display apparatus of FIG. 1. As shown in FIG. 2, the pixel PX includes a pixel circuit PC, and an organic light-emitting diode OLED electrically connected to the pixel circuit PC.

The pixel circuit PC may include a first transistor T1, a second transistor T2, and a storage capacitor Cst. The second transistor T2 is a switching transistor connected to a scan line SL and a data line DL, and is turned on according to a switching signal input from the scan line SL to transfer a data signal input from the data line DL to the first transistor T1. One end of the storage capacitor Cst is electrically connected to the second transistor T2, and the other end of the storage capacitor Cst is electrically connected to the driving voltage line PL. The storage capacitor Cst may store a voltage corresponding to a difference between a voltage transferred from the second transistor T2 and a driving power voltage ELVDD supplied to the driving voltage line PL.

The first transistor T1 is a driving transistor electrically connected to the driving voltage line PL and the storage capacitor Cst, and may control a magnitude of a driving current flowing from the driving voltage line PL to the organic light-emitting diode OLED, the magnitude of the driving current corresponding to a value of the voltage stored in the storage capacitor Cst. The organic light-emitting diode OLED may emit light having a desired luminance according to the driving current. An opposite electrode 530 (e.g., see FIG. 4) of the organic light-emitting diode OLED may receive a supply of an electrode power voltage ELVSS.

FIG. 2 shows that the pixel circuit PC includes two transistors and one storage capacitor, but the present disclosure is not limited thereto. For example, the number of thin film transistors and/or the number of storage capacitors may be variously modified depending on a design of the pixel circuit PC.

Figure 3:
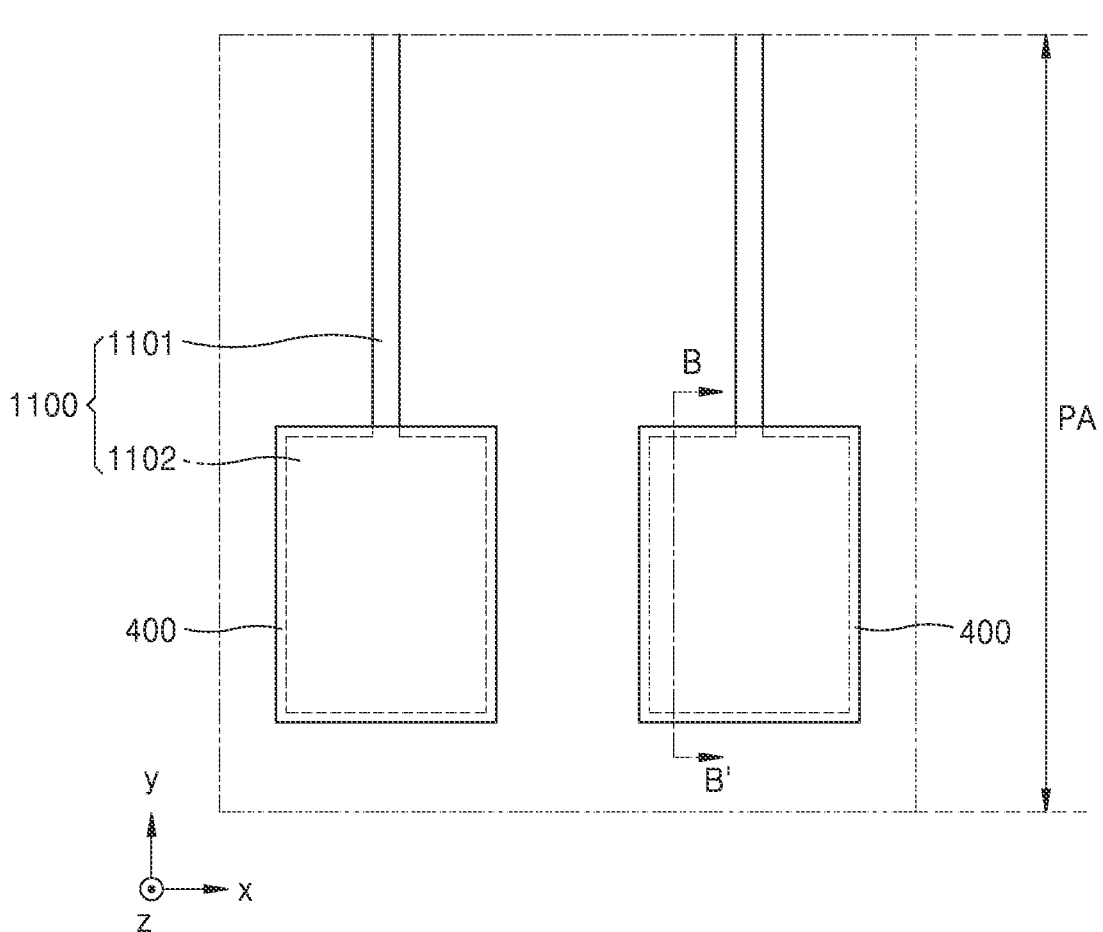
FIG. 3 is a plan view schematically showing an enlarged view of the portion A in FIG. 1.

FIG. 3 is a plan view schematically showing an enlarged view of the portion A in FIG. 1.

As shown in FIG. 3, connecting lines 1100 may be arranged at (e.g., in or on) the peripheral area PA. The connecting lines 1100 may electrically connect signal lines at (e.g., in or on) the display area DA, for example, such as data lines, to the pads 400. Each of the connecting lines 1100 may include a first portion 1101 and a second portion 1102. The first portion 1101 extends in one direction in order to electrically connect the signal line to the pad 400, and the second portion 1102 is arranged at an end portion of the first portion 1101.

The pad 400 may overlap with a corresponding one of the connecting lines 1100. In more detail, the pad 400 may be located on the second portion 1102 of the connecting line 1100, and overlaps with the second portion 1102 of the connecting line 1100. The pad 400 may have a multi-layered structure including a plurality of layers, which will be described in more detail below.

Figure 4:
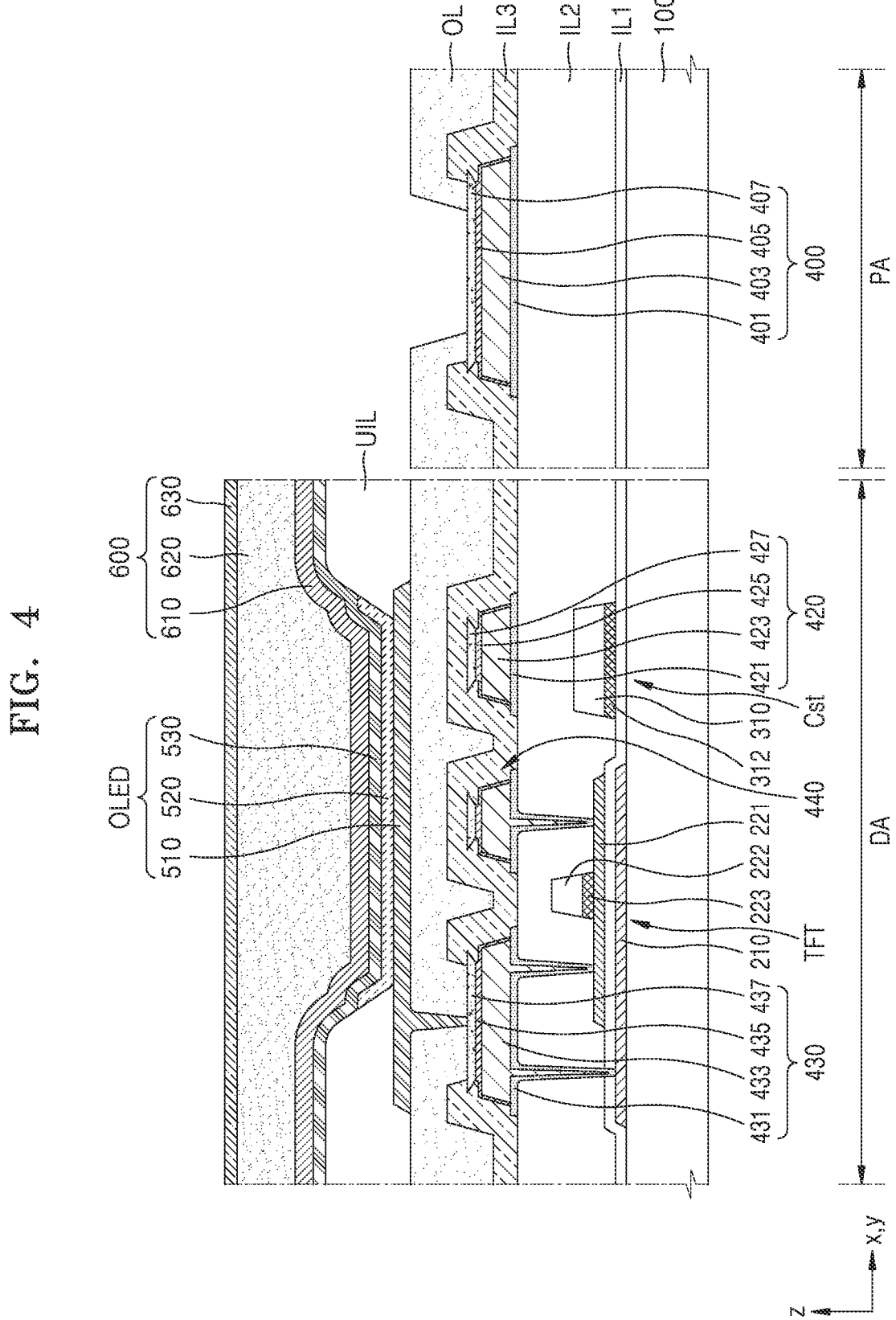
FIG. 4 is a cross-sectional view schematically showing a portion of the display apparatus of FIG. 1.

FIG. 4 is a cross-sectional view schematically showing a portion of the display apparatus of FIG. 1.

As shown in FIG. 4, the display apparatus according to an embodiment includes the substrate 100. The substrate 100 may include various suitable flexible or bendable materials. For example, the substrate 100 may include glass, metal, or a polymer resin. The polymer resin may include, for example, polyethersulphone, polyacrylate, polyetherimide, polyethylene naphthalate, polyethylene terephthalate, polyphenylene sulfide, polyarylate, polyimide, polycarbonate, cellulose acetate propionate, and/or the like. The substrate 100 may be variously modified, for example, the substrate 100 may have a multi-layered structure including two layers, and a barrier layer located between the two layers. The two layers may each include a polymer resin, and the barrier layer may include an inorganic material, such as silicon oxide, silicon nitride, silicon oxynitride, and/or the like.

A display element, and a thin film transistor TFT electrically connected to the display element, may be located on the substrate 100. In FIG. 4, an organic light-emitting diode OLED is located on the substrate 100 as the display element. The organic light-emitting diode OLED is electrically connected to the thin film transistor TFT, which may be understood that a pixel electrode 510 of the organic light-emitting diode OLED is electrically connected to the thin film transistor TFT.

The thin film transistor TFT includes a semiconductor layer 221 including amorphous silicon, polycrystalline silicon, an organic semiconductor material, or an oxide semiconductor material. In addition, the thin film transistor TFT may include a gate electrode 222, a source electrode 440, and/or a drain electrode 430. The gate electrode 222 may have various suitable layered structures including various suitable conductive materials, for example, such as a Mo layer and an Al layer. As another example, the gate electrode 222 may include a TiNx layer, an Al layer, and/or a Ti layer. The source electrode 440 and the drain electrode 430 may also have various suitable layered structures including various suitable conductive materials, such as a Ti layer, an Al layer, and/or a Cu layer.

In order to ensure an insulating property between the semiconductor layer 221 and the gate electrode 222, a gate insulating layer 223 may be located between the semiconductor layer 221 and the gate electrode 222. The gate insulating layer 223 may include an inorganic material, such as silicon oxide, silicon nitride, and/or silicon oxynitride. In FIG. 4, the gate insulating layer 223 is patterned in the same or substantially the same shape as that of the gate electrode 222, but the present disclosure is not limited thereto. For example, the gate insulating layer 223 may have a shape corresponding to an entire or substantially the entire surface of the substrate 100, and may have a structure in which contact holes are formed at suitable positions (e.g., predetermined or preset positions).

In addition, a second insulating layer IL2 including an inorganic material, such as silicon oxide, silicon nitride, and/or silicon oxynitride, may be disposed on the gate electrode 222, and the source electrode 440 and the drain electrode 430 may be disposed on the second insulating layer IL2. The source electrode 440 and the drain electrode 430 may each have a multi-layered structure including a plurality of layers, which will be described in more detail below.

However, the present disclosure is not limited thereto. For example, the thin film transistor TFT may include only one of the source electrode 440 or the drain electrode 430, or may not include both the source electrode 440 and the drain electrode 430. For example, one thin film transistor TFT may not include the drain electrode 430, another thin film transistor TFT connected to the one thin film transistor TFT may not include the source electrode 440, and semiconductor layers 221 of the two thin film transistors TFT may be connected to each other. The above connecting structure may result in the same or substantially the same effect as that of an example in which one thin film transistor includes the source electrode and another thin film transistor includes the drain electrode, and the source electrode of the one thin film transistor is connected to the drain electrode of the other thin film transistor.

The insulating layer including the inorganic material may be obtained by a chemical vapor deposition (CVD) method or an atomic layer deposition (ALD) method. This will also be applied to embodiments and modifications thereof that will be described in more detail below.

The storage capacitor Cst may include a first electrode 310 and a second electrode 420. The first electrode 310 of the storage capacitor Cst may be formed by the same or substantially the same process as that for forming the gate electrode 222, and may include the same material as that of the gate electrode 222. An insulating layer 312 may be disposed under (e.g., underneath) the first electrode 310, and the insulating layer 312 may include the same material as that of the gate insulating layer 223. The gate insulating layer 223 under (e.g., underneath) the gate electrode 222 and the insulating layer 312 under (e.g., underneath) the first electrode 310 may be formed by a mask process (e.g., a patterning process) that is the same as that of the gate electrode 222 and the first electrode 310, and thus, the shape of the gate insulating layer 223 in a plan view may be the same or substantially the same as that of the gate electrode 222, and the shape of the insulating layer 312 may be the same or substantially the same as that of the first electrode 310. Unlike the above example, the insulating layer 312 may be integrally formed as a single body with the gate insulating layer 223, and may have a shape covering the semiconductor layer 221 while corresponding to the entire or substantially the entire surface of the substrate 100.

The source electrode 440 and the drain electrode 430 of the thin film transistor TFT, and the second electrode 420 of the storage capacitor Cst, may be formed together in a patterning process for forming the pad 400. Therefore, the source electrode 440, the drain electrode 430, and the second electrode 420 may include a multi-layered structure, like that of the pad 400. The multi-layered structure will be described in more detail below.

In addition, a lower metal layer 210 may be disposed under (e.g., underneath) the semiconductor layer 221 of the thin film transistor TFT. The lower metal layer 210 may be electrically connected to one of the source electrode 440 or the drain electrode 430. In FIG. 4, the lower metal layer 210 is electrically connected to the drain electrode 430. In this case, the lower metal layer 210 may function as a wiring, if necessary or desired. However, the present disclosure is not limited thereto. For example, the lower metal layer 210 may not be connected to the thin film transistor TFT. In this case, the lower metal layer 210 may have an isolated shape. If desired, the driving voltage line PL may be electrically connected to the lower metal layer 210, so that the driving power voltage ELVDD, which is a constant or substantially constant voltage, is applied to the lower metal layer 210, or an electrode voltage line may be electrically connected to the lower metal layer 210, so that the electrode power voltage ELVSS, which is a constant or substantially constant voltage, is applied to the lower metal layer 210. In this case, the lower metal layer 210 may shield the thin film transistor TFT.

The lower metal layer 210 may include one or more materials selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), and copper (Cu).

A first insulating layer IL1 may be arranged between the lower metal layer 210 and the semiconductor layer 221. For example, the first insulating layer IL1 may be formed on the entire or substantially the entire surface of the substrate 100, so as to cover the lower metal layer 210. In this case, the first insulating layer IL1 may be located under (e.g., underneath) the storage capacitor Cst and the pad 400. The first insulating layer IL1 may include, for example, an inorganic material, such as silicon oxide, silicon nitride, and/or silicon oxynitride. The first insulating layer IL1 may increase a flatness of an upper surface of the substrate 100, or may prevent or reduce infiltration of impurities from the substrate 100 into the semiconductor layer 221 of the thin film transistor TFT.

The second insulating layer IL2 may be disposed on the gate electrode 222, as described above. The second insulating layer IL2 may be formed on the entire or substantially the entire surface of the substrate 100, so as to cover the gate electrode 222. Accordingly, the source electrode 440 and the drain electrode 430 may be disposed on the second insulating layer IL2. The second insulating layer IL2 may cover the first electrode 310 of the storage capacitor Cst, and the second electrode 420 of the storage capacitor Cst and the pad 400 may be disposed on the second insulating layer IL2.

The second insulating layer IL2 may include, for example, an inorganic material, such as silicon oxide, silicon nitride, and/or silicon oxynitride. As another example, the second insulating layer IL2 may include an organic material, and may have a flat or substantially flat upper surface. In the latter example, the second insulating layer IL2 may include, for example, an organic material such as acryl, benzocyclobutene (BCB), or hexamethyldisiloxane (HMDSO).

A third insulating layer IL3 may be disposed on the source electrode 440 and the drain electrode 430. In more detail, the third insulating layer IL3 may be formed on the entire or substantially the entire surface of the substrate 100, so as to cover the source electrode 440, the drain electrode 430, and the second electrode 420 of the storage capacitor Cst. The third insulating layer IL3 may cover the pad 400. The third insulating layer IL3 may include, for example, an inorganic material, such as silicon oxide, silicon nitride, and/or silicon oxynitride.

An organic insulating layer OL may be disposed on the third insulating layer IL3. As shown in FIG. 4, when the organic light-emitting diode OLED is disposed on the thin film transistor TFT, the organic insulating layer OL may planarize or substantially planarize an upper portion of a protective layer that covers the thin film transistor TFT. The organic insulating layer OL may include, for example, an organic material, such as acryl, BCB, HMDSO, and/or the like. In FIG. 4, the organic insulating layer OL is shown as having a single-layer structure, but various suitable modifications may be made to the organic insulating layer OL, such as the organic insulating layer OL may have a multi-layered structure.

A display element may be located on the organic insulating layer OL of the substrate 100. The organic light-emitting diode OLED shown in FIG. 4 may be used as the display element. The organic light-emitting diode OLED may include, for example, a pixel electrode 510, an opposite electrode 530, and an intermediate layer 520 between the pixel electrode 510 and the opposite electrode 530. The intermediate layer 520 includes an emission layer. The pixel electrode 510 may be in contact with one of the source electrode 440 or the drain electrode 430 via a contact hole formed in the organic insulating layer OL to be electrically connected to the thin film transistor TFT, as shown in FIG. 4. The pixel electrode 510 includes a light-transmitting conductive layer and a reflective layer. The light-transmitting conductive layer includes a conductive oxide for transmitting light, for example, such as ITO, $In_2O_3$, or IZO, and the reflective layer includes a metal, such as Al or Ag. For example, the pixel electrode 510 may have a triple-layered structure including ITO/Ag/ITO.

The intermediate layer 520 of the organic light-emitting diode OLED may include a low-molecular weight material or a polymer material. When the intermediate layer 520 includes a low-molecular weight material, the intermediate layer 520 may include a hole injection layer (HIL), a hole transport layer (HTL), an emission layer (EML), an electron transport layer (ETL), an electron injection layer (EIL), and/or the like. When the intermediate layer 520 includes a polymer material, the intermediate layer 520 may include an HTL and an EML. The above described layers may be formed by a deposition method, an inkjet printing method, a screen printing method, a laser-induced thermal imaging (LITI) method, and/or the like.

However, the present disclosure is not limited thereto, and the intermediate layer 520 may have various suitable structures. In addition, the intermediate layer 520 may be formed integrally as a single body throughout the plurality of pixel electrodes 510, or may be patterned to correspond to each of the plurality of pixel electrodes 510.

The opposite electrode 530 is disposed above the display area DA, and may cover the display area DA, as shown in FIG. 4. In other words, the opposite electrode 530 may be integrally formed as a single body with respect to the plurality of organic light-emitting diodes OLED, and corresponds to the plurality of pixel electrodes 510. The opposite electrode 530 may include a light-transmitting conductive layer including ITO, $In_2O_3$, IZO, and/or the like, and may include a semi-transmissive layer including a metal, such as Al, Ag, and/or the like. For example, the opposite electrode 530 may include a semi-transmissive layer including MgAg.

A pixel defining layer UIL may be disposed on the organic insulating layer OL. The pixel defining layer UIL may have an opening corresponding to each of the pixels, or in other words, an opening exposing at least a center portion of the pixel electrode 510 to define the pixels. Also, as shown in FIG. 4, the pixel defining layer UIL may increase a distance between an edge of the pixel electrode 510 and the opposite electrode 530, and prevents or substantially prevents the generation of arcs and/or the like from the edge of the pixel electrode 510. The pixel defining layer UIL may include, for example, an organic material such as polyimide, HMDSO, and/or the like.

Because the organic light-emitting diode OLED may be easily damaged by external moisture and/or oxygen, an encapsulation layer 600 may cover the organic light-emitting diode OLED to protect the organic light-emitting diode OLED. The encapsulation layer 600 may cover the display area DA, and may extend to an outer side of the display area DA. The encapsulation layer 600 may include a first inorganic encapsulation layer 610, an organic encapsulation layer 620, and a second inorganic encapsulation layer 630, as shown in FIG. 4.

The first inorganic encapsulation layer 610 covers the opposite electrode 530, and may include silicon oxide, silicon nitride, and/or silicon oxynitride. When desired, other layers, such as a capping layer and/or the like, may be provided between the first inorganic encapsulation layer 610 and the opposite electrode 530. Because the first inorganic encapsulation layer 610 is arranged along a lower structure of the encapsulation layer 600, as shown in FIG. 4, the first inorganic encapsulation layer 610 may have an upper surface that is not flat. The organic encapsulation layer 620 covers the first inorganic encapsulation layer 610, and may have a flat or substantially flat upper surface, unlike that of the first inorganic encapsulation layer 610. The organic encapsulation layer 620 may include one or more materials selected from the group consisting of polyethylene terephthalate, polyethylene naphthalate, polycarbonate, polyimide, polyethylene sulfonate, polyoxymethylene, polyarylate, and hexamethyl disiloxane. The second inorganic encapsulation layer 630 covers the organic encapsulation layer 620, and may include silicon oxide, silicon nitride, and/or silicon oxynitride. The second inorganic encapsulation layer 630 is in contact with the first inorganic encapsulation layer 610 at an edge thereof at (e.g., in or on) an outer portion of the display area DA, and the organic encapsulation layer 620 may not be exposed to the outside.

The pad 400 may be arranged at (e.g., in or on) the peripheral area PA. As described above, the pad 400 is arranged to overlap with a part of the connecting line 1100 (e.g., see FIG. 3), and may be electrically connected to the signal lines arranged at (e.g., in or on) the display area DA via the connecting line 1100. In FIG. 4, the connecting line 1100 is not shown for convenience of illustration. The pad 400 may have a multi-layered structure including a plurality of layers. For example, the pad 400 may include a second metal layer 403, a first metal layer 401 disposed under (e.g., underneath) the second metal layer 403, an oxide conductive layer 407 disposed over the second metal layer 403, and a first metal oxide layer 405 disposed between the second metal layer 403 and the oxide conductive layer 407. The pad 400 will be described in more detail below.

Figure 5:
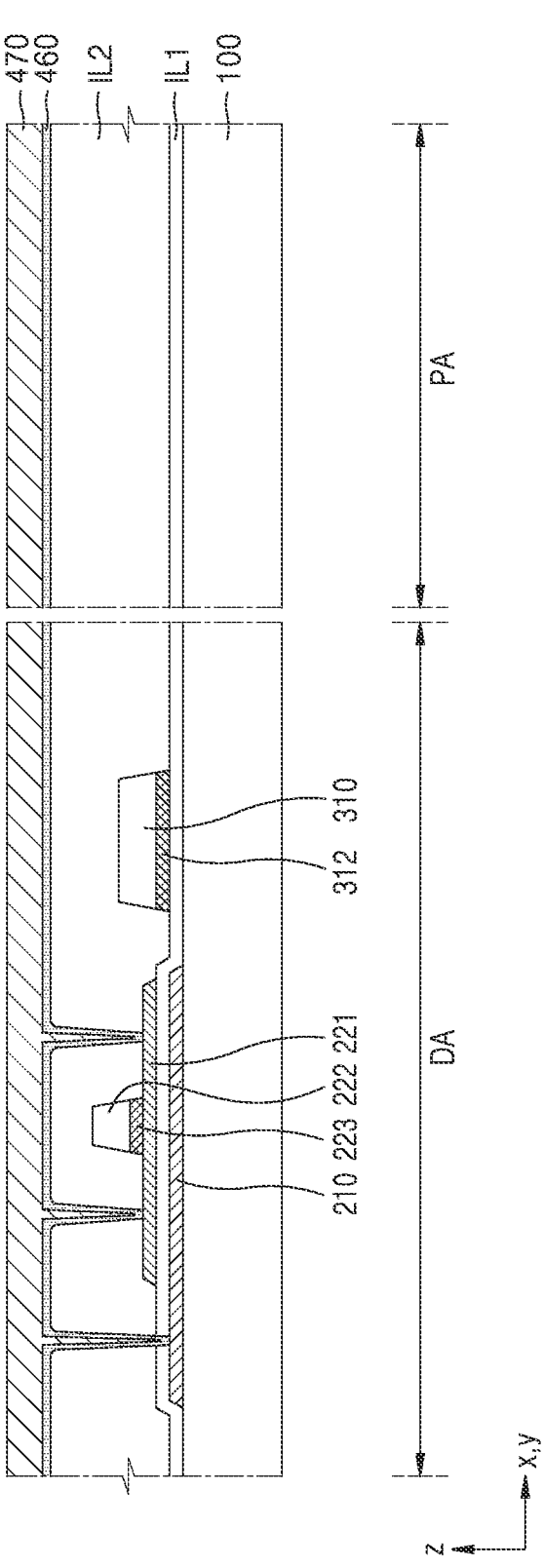
FIGS. 5-10 are cross-sectional views schematically showing various processes of a method of manufacturing the display apparatus of FIG. 4.
Figure 6:
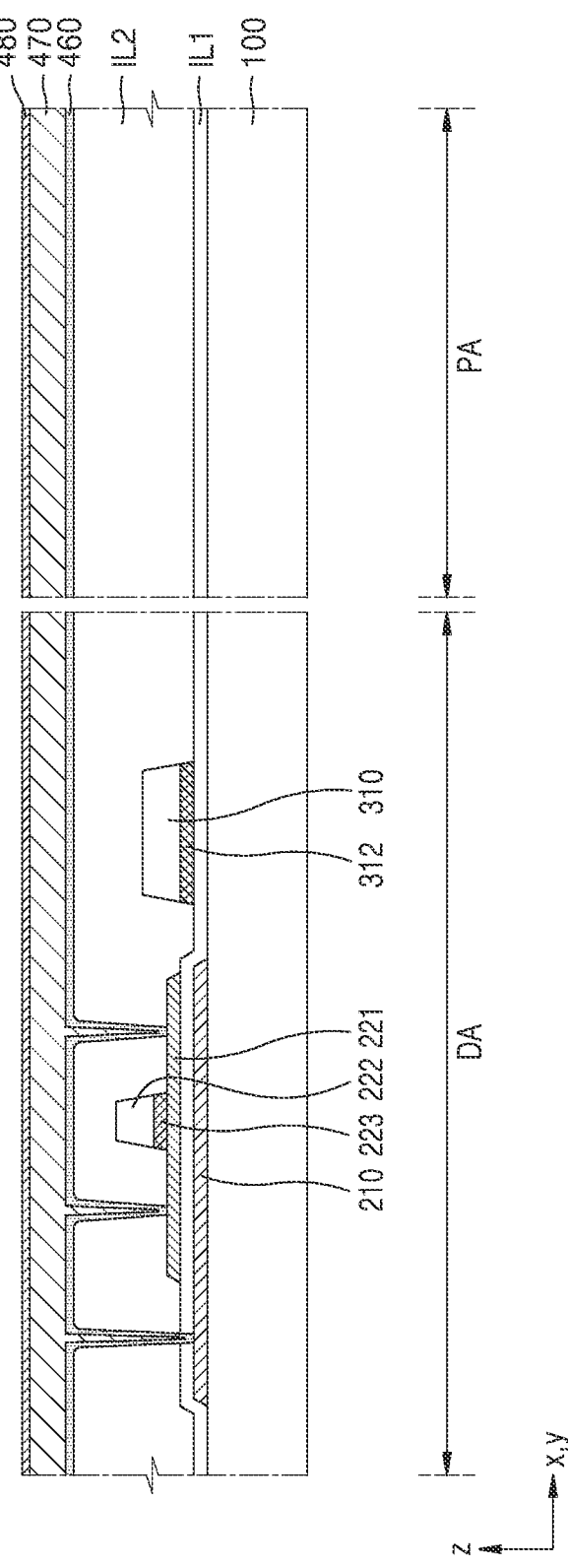
Figure 7:
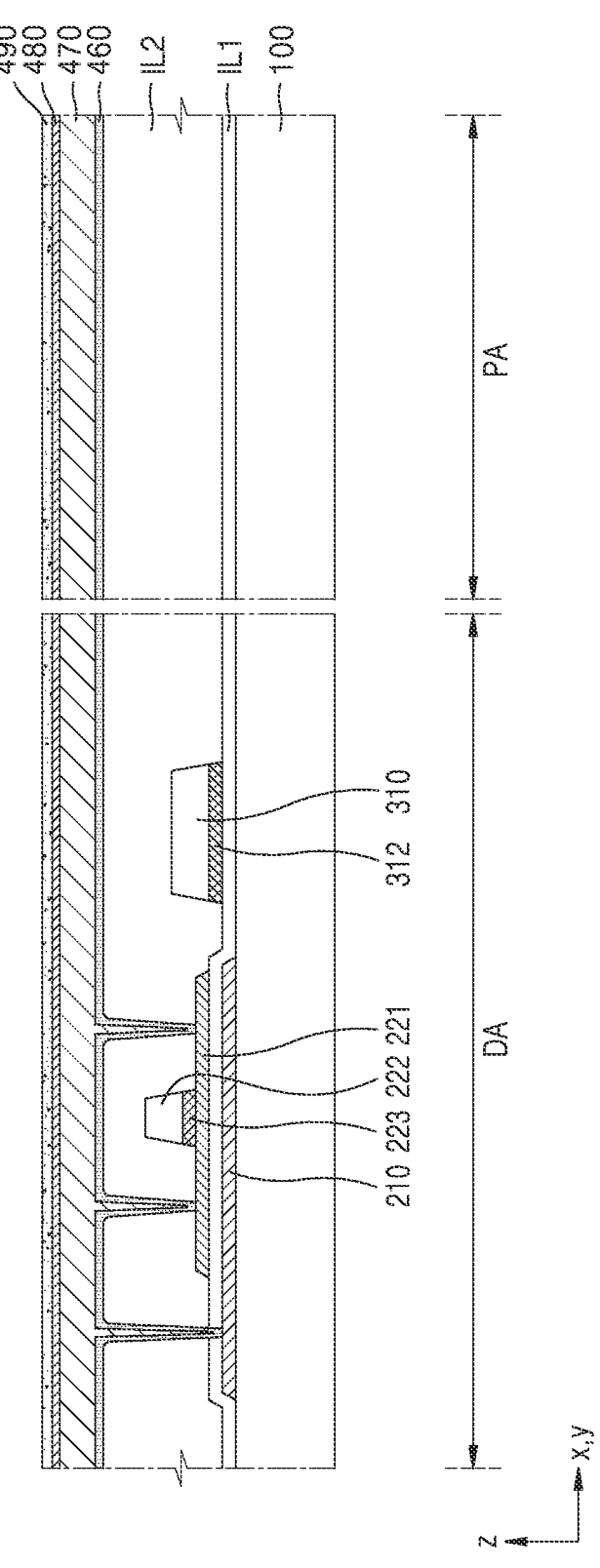

FIGS. 5 to 10 are cross-sectional views schematically showing various processes of a method of manufacturing the display apparatus of FIG. 4. In more detail, FIGS. 5 to 7 are cross-sectional views schematically showing processes of a method of manufacturing the source electrode 440 and the drain electrode 430 of the thin film transistor TFT, the second electrode 420 of the storage capacitor Cst, and the pad 400.

As shown in FIG. 5, a first metal layer forming layer 460 is formed on the substrate 100, and a second metal layer forming layer 470 is formed on the first metal layer forming layer 460. The first metal layer forming layer 460 is formed on the substrate 100 to correspond to the entire or substantially the entire surface of the substrate 100 by a sputtering method and/or the like in a first chamber of a first deposition cluster. The second metal layer forming layer 470 may be formed on the first metal layer forming layer 460 to correspond to the entire or substantially the entire surface of the substrate 100 by a sputtering method and/or the like in a second chamber of the first deposition cluster. As described above, the first metal layer forming layer 460 and the second metal layer forming layer 470 may be sequentially (e.g., successively) deposited in the first deposition cluster. The first metal layer forming layer 460 may include titanium, and the second metal layer forming layer 470 may include copper. However, the present disclosure is not limited thereto. For example, the second metal layer forming layer 470 may include aluminum, silver, or gold.

Then, the substrate 100 is moved out of the first deposition cluster, and the upper surface of the second metal layer forming layer 470 and/or the like is cleaned by using a cleaning device. For example, the second metal layer forming layer 470 may be cleaned by spraying deionized water on the second metal layer forming layer 470 and/or the like, or may be cleaned while applying ultrasound waves thereto. Through the cleaning process, as shown in FIG. 6, a first metal oxide layer forming layer 480 is formed on the upper surface of the second metal layer forming layer 470. The first metal oxide layer forming layer 480 is formed when the upper surface of the second metal layer forming layer 470 is oxidized. Accordingly, the first metal oxide layer forming layer 480 may include an oxide material of the metal included in the second metal layer forming layer 470. When the second metal layer forming layer 470 includes copper, the first metal oxide layer forming layer 480 may include copper oxide.

As described above, the upper surface and/or the like of the second metal layer forming layer 470 is cleaned, and afterwards, an oxide conductive layer forming layer 490 is formed over the second metal layer forming layer 470, that is, on the first metal oxide layer forming layer 480, as shown in FIG. 7. The oxide conductive layer forming layer 490 may be formed in a third chamber, and the third chamber may be included in the first deposition cluster, or may be included in a second deposition cluster that is different from the first deposition cluster. The oxide conductive layer forming layer 490 may include indium tin oxide (ITO). In more detail, the oxide conductive layer forming layer 490 may include amorphous ITO.

When the first metal layer forming layer 460 and the second metal layer forming layer 470 are formed in the first chamber and the second chamber of the first deposition cluster, temperatures of the first and second chambers may be maintained or substantially maintained to be very high, and the surface temperature of the second metal layer forming layer 470 may be also maintained or substantially maintained to be very high. When the oxide conductive layer forming layer 490 including the ITO is directly formed while in the above described state, the oxide conductive layer forming layer 490 formed under the high temperature includes crystalline ITO.

However, in the processes of manufacturing the display apparatus according to an embodiment, the first metal layer forming layer 460 and the second metal layer forming layer 470 are formed in the first chamber and the second chamber of the first deposition cluster, and afterwards, the substrate 100 and/or the like is moved to the outside of the first deposition cluster, such that the upper surface of the second metal layer forming layer 470 is cleaned by using the cleaning device. In addition, the oxide conductive layer forming layer 490 is formed in the third chamber. Therefore, the oxide conductive layer forming layer 490 that is formed on the first metal oxide layer forming layer 480 may include the amorphous ITO.

Figure 8:
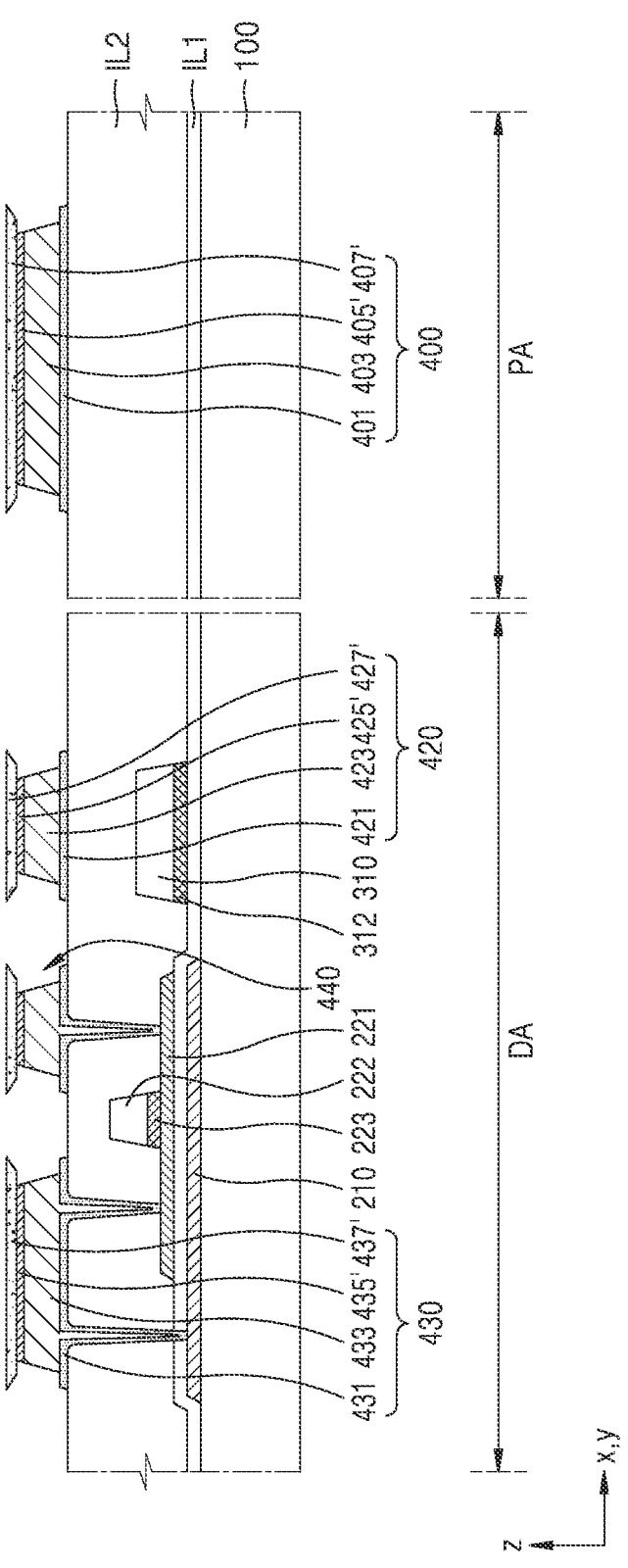

Subsequently, the first metal layer forming layer 460, the second metal layer forming layer 470, the first metal oxide layer forming layer 480, and the oxide conductive layer forming layer 490 are concurrently (e.g., simultaneously) patterned, and the pad 400 as shown in FIG. 8 is formed. Accordingly, the pad 400 includes the first metal layer 401, the second metal layer 403 disposed on the first metal layer 401, a first metal oxide layer 405' disposed on the second metal layer 403 and in surface-contact with the second metal layer 403, and an oxide conductive layer 407' disposed on the first metal oxide layer 405' and in surface-contact with the first metal oxide layer 405'. The first metal layer 401 includes titanium, the second metal layer 403 includes copper, the first metal oxide layer 405' includes an oxide of the metal included in the second metal layer 403, or in other words, copper oxide, and the oxide conductive layer 407' may include ITO, for example, such as amorphous ITO.

During the process of forming the pad 400, the source electrode 440 and the drain electrode 430 of the thin film transistor TFT, and the second electrode 420 of the storage capacitor Cst, may be concurrently (e.g., simultaneously) formed along with the pad 400. Therefore, the source electrode 440 and the drain electrode 430 of the thin film transistor TFT, and the second electrode 420 of the storage capacitor Cst may include a multi-layered structure, like that of the pad 400. Accordingly, sub-layers of the source electrode 440, sub-layers 431, 433, 435', and 437' of the drain electrode 430, and sub-layers 421, 423, 425', and 427' of the second electrode 420 of the storage capacitor Cst may include the same materials as those of the first metal layer 401, the second metal layer 403, the first metal oxide layer 405', and the oxide conductive layer 407', which are the sub-layers of the pad 400.

As shown in FIG. 8, in the cross-sectional view, the sub-layers of the source electrode 440, the sub-layers 431, 433, 435', and 437' of the drain electrode 430, and the sub-layers 421, 423, 425', and 427' of the second electrode 420 of the storage capacitor Cst may have shapes that are similar to or the same as those of the first metal layer 401, the second metal layer 403, the first metal oxide layer 405', and the oxide conductive layer 407', which are the sub-layers of the pad 400. This may also be applied to embodiments and modifications thereof that will be described in more detail below.

As described above, the first metal layer forming layer 460, the second metal layer forming layer 470, the first metal oxide layer forming layer 480, and the oxide conductive layer forming layer 490 are concurrently (e.g., simultaneously) patterned, and the pad 400 as shown in FIG. 8 is formed. In this case, the oxide conductive layer 407' of the pad 400 may protrude out of the second metal layer 403 and the first metal oxide layer 405'. This may also occur in the source electrode 440, the drain electrode 430, and the second electrode 420 of the storage capacitor Cst, in addition to the pad 400.

An etch ratio of the oxide conductive layer forming layer 490 including the amorphous ITO with respect to an etchant is less than those of the second metal layer forming layer 470 including copper and the first metal oxide layer forming layer 480 including copper oxide. Accordingly, after a first patterning process that is a first etching process, the edge of the oxide conductive layer 407' including amorphous ITO protrudes out of the second metal layer 403 and the first metal oxide layer 405' including copper, and thus, the oxide conductive layer 407' has a protrusion, such as a tip. When the third insulating layer IL3 (e.g., see FIG. 11) is formed on the oxide conductive layer 407' having the tip, the third insulating layer IL3 may not completely cover upper and side surfaces of the oxide conductive layer 407' due to the tip of the oxide conductive layer 407', and thus, the side surface of the pad 400 may be partially exposed. In this case, when wirings or electrodes are formed thereon, the wirings or the electrodes may unintentionally contact the side surface of the pad 400, and a defect, such as a wiring or an electrode being unintentionally electrically connected to the pad 400, may occur. As another example, the tip of the oxide conductive layer 407' may be cut during the manufacturing process, and may cause a defect in which the cut tip is in contact with other wirings, such that shorts and/or the like may be generated among the wirings. This may occur also in the source electrode 440, the drain electrode 430, and the second electrode 420 of the storage capacitor Cst, in addition to the pad 400.

Figure 9:
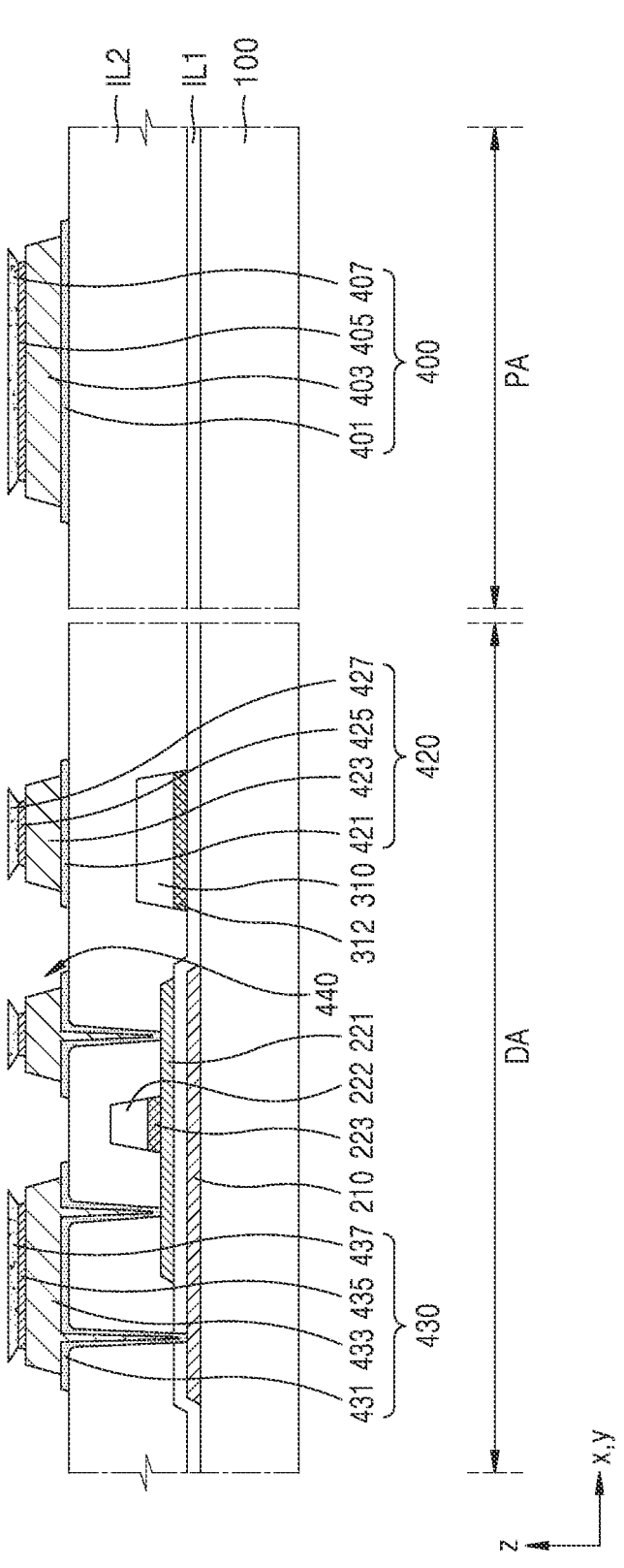

In order to prevent or substantially prevent such defects, when the display apparatus is manufactured according to an embodiment, a second patterning process that is a second etching process is performed to remove (e.g., or to reduce) the tip as shown in FIG. 9. In other words, the second patterning process is a process of etching and patterning the oxide conductive layer 407' formed from the oxide conductive layer forming layer 490 by the first patterning process, and may be a process of removing (e.g., or reducing) the tip from the oxide conductive layer 407'. The sub-layer 437' of the drain electrode 430, the sub-layer 427' of the second electrode 420 of the storage capacitor Cst, and the sub-layer of the source electrode 440 are also patterned at the same time, and thus, the tips of the above layers may be also removed (e.g., or reduced).

An etchant used in the second patterning process may include a metal inhibitor in order to selectively etch the oxide conductive layer 407' including the amorphous ITO. The etchant used in the first patterning process may also include the metal inhibitor if necessary or desired, but an amount thereof may be relatively small. In other words, the weight percent wt % of the metal inhibitor included in the etchant used in the second patterning process may be greater than the weight percent wt % of the metal inhibitor included in the etchant used in the first patterning process.

Through the above processes, the pad 400 as shown in FIG. 9 may be formed. Accordingly, the pad 400 includes the first metal layer 401, the second metal layer 403 disposed on the first metal layer 401, a first metal oxide layer 405 disposed on the second metal layer 403 and in surface-contact with the second metal layer 403, and an oxide conductive layer 407 disposed on the first metal oxide layer 405 and in surface-contact with the first metal oxide layer 405. The first metal layer 401 includes titanium, the second metal layer 403 includes copper, the first metal oxide layer 405 includes an oxide of the metal included in the second metal layer 403, such as copper oxide, and the oxide conductive layer 407 may include ITO, for example, such as amorphous ITO. The oxide conductive layer 407 may not include a tip that protrudes out of the second metal layer 403.

Through the above processes, the source electrode 440 and the drain electrode 430 of the thin film transistor TFT, and the second electrode 420 of the storage capacitor Cst may include a multi-layered structure that is the same as or similar to that of the pad 400. Accordingly, sub-layers of the source electrode 440, sub-layers 431, 433, 435, and 437 of the drain electrode 430, and sub-layers 421, 423, 425, and 427 of the second electrode 420 of the storage capacitor Cst may include the same materials as those of the first metal layer 401, the second metal layer 403, the first metal oxide layer 405, and the oxide conductive layer 407, which are the sub-layers of the pad 400, and thus, may not have tips protruding out.

Figure 10:
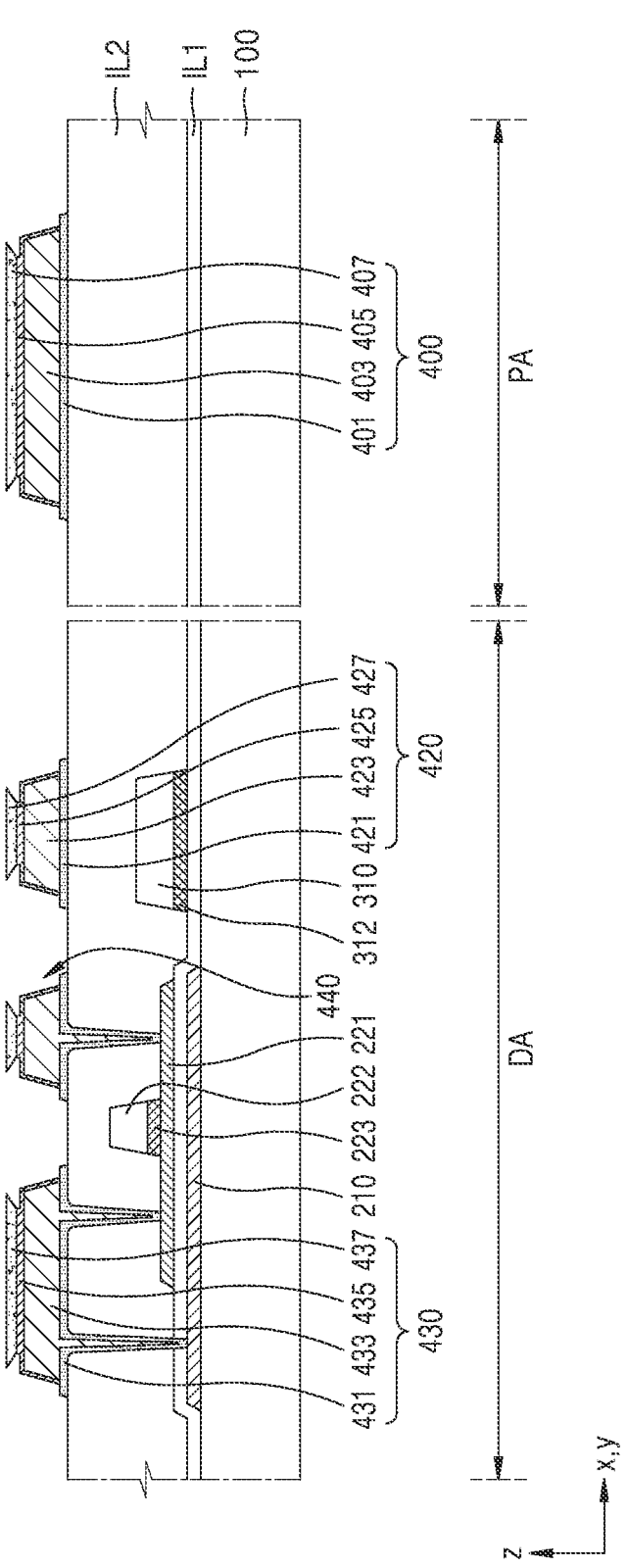

In addition, after forming the pad 400 and/or the like through the patterning process, the second metal layer 403 and/or the like may be in contact with oxygen, moisture, and/or the like through a process of cleaning the upper surface and/or the like of the pad 400 and through manufacturing processes after the cleaning process. Accordingly, the surface exposed out of the second metal layer 403 may be oxidized again, and as shown in FIG. 10, the second metal oxide layer 406 (e.g., see FIG. 11) that is located on the side surface portion and/or the like of the second metal layer 403, so as to be located outside the first metal oxide layer 405, may be formed. The second metal oxide layer 406 will be described in more detail below.

Figure 11:
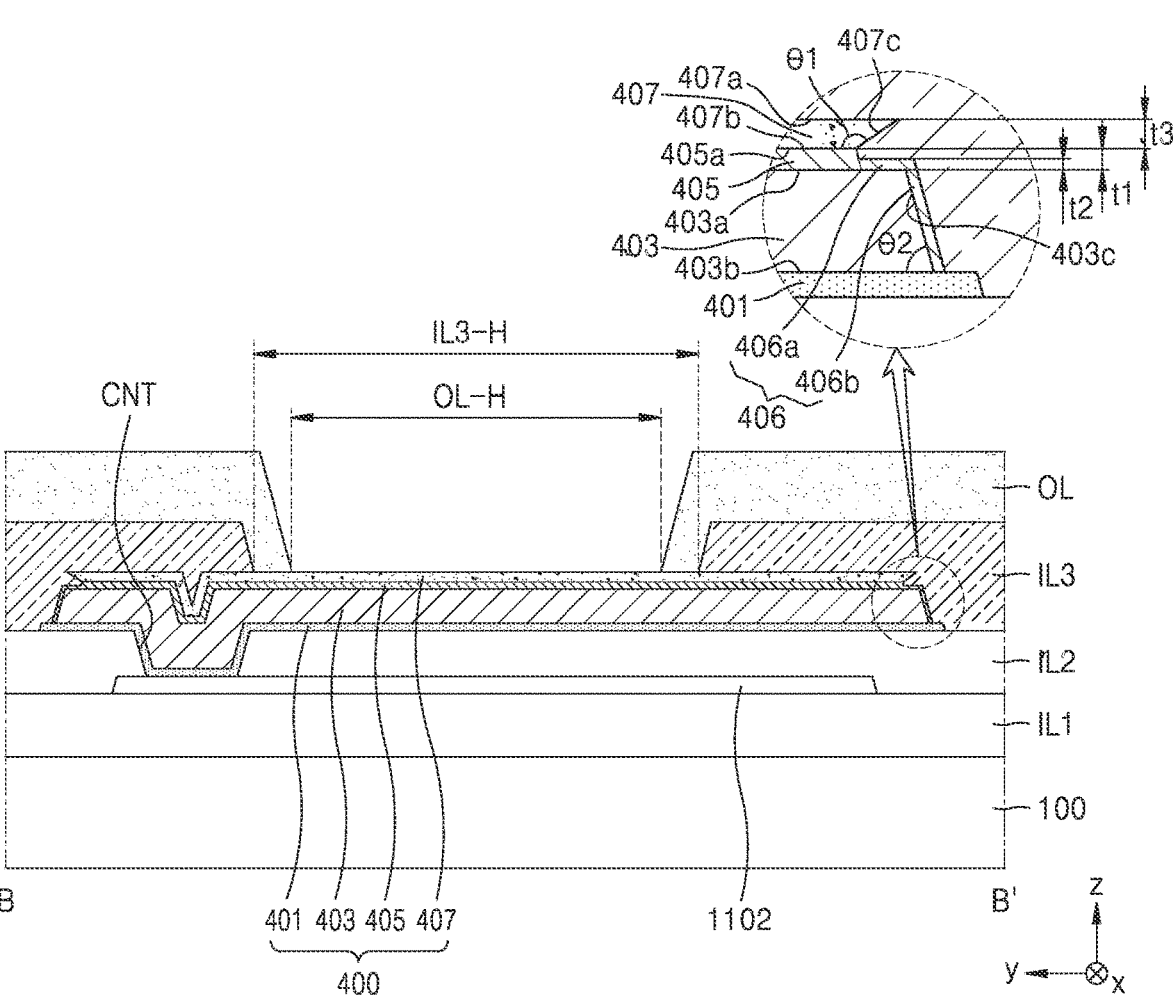
FIG. 11 is a cross-sectional view of the display apparatus taken along the line B-B' of FIG. 3.

FIG. 11 is a cross-sectional view of the display apparatus taken along the line B-B' of FIG. 3, and shows the cross-sectional structure of the pad 400 in more detail.

As shown in FIG. 11, an area of a bottom surface 407*b* of the oxide conductive layer 407 in a direction toward the first metal oxide layer 405 (e.g., a −z direction) is less than that of an upper surface 407*a* thereof. In addition, a side surface 407*c* of the oxide conductive layer 407 is inclined with respect to an upper surface 405*a* of the first metal oxide layer 405.

As described above, the pad 400 and/or the like is formed by the first patterning process that is the first etching process, in which the first metal layer forming layer 460, the second metal layer forming layer 470, the first metal oxide layer forming layer 480, and the oxide conductive layer forming layer 490 are concurrently (e.g., simultaneously) patterned, and the second patterning process that is the second etching process. Here, because the etch ratio of the first metal oxide layer forming layer 480 including copper oxide with respect to the etchant used in the patterning process is greater than that of the oxide conductive layer forming layer 490 including the amorphous ITO, the lower portion of the oxide conductive layer forming layer 490 (e.g., in the −z direction) is relatively etched more than the upper portion thereof. Therefore, an area of the bottom surface 407*b* of the oxide conductive layer 407 in a direction toward the first metal oxide layer 405 (e.g., in the −z direction) is less than that of the upper surface 407*a* of the oxide conductive layer 407. In addition, the side surface 407*c* of the oxide conductive layer 407 is inclined with respect to the upper surface 405*a* of the first metal oxide layer 405.

During the etching process, the first metal oxide layer forming layer 480 is removed entirely from the outside of the bottom surface 407*b* of the oxide conductive layer 407. Therefore, the first metal oxide layer 405 is disposed only between the bottom surface 407*b* of the oxide conductive layer 407 and the second metal layer 403. Accordingly, the area of the upper surface 405*a* of the first metal oxide layer 405 is the same or substantially the same as the area of the bottom surface 407*b* of the oxide conductive layer 407 in the direction toward the first metal oxide layer 405 (e.g., in the −z direction). In addition, as described above, the exposed surface of the second metal layer 403 is oxidized again in post processes, and thus, the second metal oxide layer 406 on the second metal layer 403 is formed, such that the second metal oxide layer 406 is located outside the first metal oxide layer 405. The second metal oxide layer 406 may include an oxide of the metal included in the second metal layer 403, such as copper oxide, like that of the first metal oxide layer 405. In other words, the first metal oxide layer 405 and the second metal oxide layer 406 may include the same material as each other. In addition, the second metal oxide layer 406 may be integrally formed as a single body with the first metal oxide layer 405. The second metal oxide layer 406 may include a 2-1st metal oxide layer 406*a* located on the upper surface 403*a* of the second metal layer 403 to be located outside the first metal oxide layer 405, and a 2-2nd metal oxide layer 406*b* located on the side surface 403*c* of the second metal layer 403.

The first metal oxide layer 405 is formed by the process of cleaning the upper surface and/or the like of the second metal layer forming layer 470, and the second metal oxide layer 406 is formed when coming into contact with oxygen or moisture during the process of manufacturing the display apparatus, and thus, a thickness t1 of the first metal oxide layer 405 may be greater than a thickness t2 of the second metal oxide layer 406.

In addition, as described above with reference to FIGS. 8 and 9, when the display apparatus is manufactured according to an embodiment, the first patterning process that is the first etching process and the second patterning process that is the second etching process are performed. The second patterning process is a process of etching and patterning the oxide conductive layer 407 formed by the first patterning process, and may be a process of removing (e.g., or reducing) the tip from the oxide conductive layer 407 and/or the like. Accordingly, when there is the tip of the oxide conductive layer 407 before performing the second patterning process, the area of the upper surface 407*a* of the oxide conductive layer 407 is greater than that of the upper surface 403*a* of the second metal layer 403, but after performing the second patterning process, the tip is removed (e.g., or reduced) from the oxide conductive layer 407, so that the area of the upper surface 407*a* of the oxide conductive layer 407 may be equal to or less than that of the upper surface 403*a* of the second metal layer 403.

As described above, in the processes of manufacturing the display apparatus according to the present embodiment, the first metal layer forming layer 460 and the second metal layer forming layer 470 are formed in the first chamber and the second chamber of the first deposition cluster, and afterwards, the substrate 100 and/or the like is moved to the outside of the first deposition cluster, such that the upper surface of the second metal layer forming layer 470 is cleaned by using the cleaning device. In addition, the oxide conductive layer forming layer 490 is formed in the third chamber.

When the first metal layer forming layer 460 and the second metal layer forming layer 470 are formed in the first chamber and the second chamber of the first deposition cluster, the first and second chambers maintain or substantially maintain a very high temperature, and the surface temperature of the second metal layer forming layer 470 may also be maintained or substantially maintained at a very high state. When the oxide conductive layer forming layer 490 including the ITO is directly formed in the above described state, the oxide conductive layer forming layer 490 formed under the high temperature includes crystalline ITO. An etch ratio of the crystalline ITO with respect to the etchant is greater than that of the amorphous ITO. Therefore, when the oxide conductive layer forming layer 490 includes crystalline ITO, the oxide conductive layer 407 formed by patterning the oxide conductive layer forming layer 490 has a very large tip, which may cause defects, such as those described above.

However, in the processes of manufacturing the display apparatus according to the present embodiment, the first metal layer forming layer 460 and the second metal layer forming layer 470 are formed in the first chamber and the second chamber of the first deposition cluster, and afterwards, the substrate 100 and/or the like is moved to the outside of the first deposition cluster, such that the upper surface of the second metal layer forming layer 470 is cleaned by using the cleaning device. In addition, the oxide conductive layer forming layer 490 is formed in the third chamber. As such, the oxide conductive layer forming layer 490 includes the amorphous ITO, and thus, generation of defects during the manufacturing processes may be effectively prevented or reduced.

As described above, the first metal layer forming layer 460, the second metal layer forming layer 470, the first metal oxide layer forming layer 480, and the oxide conductive layer forming layer 490 are concurrently (e.g., simultaneously) patterned, and the pad 400 is formed. The patterning process includes the first patterning process and the second patterning process, and the second patterning process is a process of etching and patterning the oxide conductive layer 407 formed by the first patterning process, and in particular, may be a process of removing (e.g., or reducing) the tip from the oxide conductive layer 407. In the second patterning process, the oxide conductive layer 407 and the first metal oxide layer 405 may be etched, and with respect to the etchant used in the second patterning process, the etch ratio of the first metal oxide layer 405 including the copper oxide is greater than that of the oxide conductive layer 407 including amorphous ITO, and thus, the lower portion of the oxide conductive layer 407 (e.g., in the −z direction) is relatively more etched than the upper portion thereof. Therefore, an area of the bottom surface 407*b* of the oxide conductive layer 407 in a direction toward the first metal oxide layer 405 (e.g., in the −z direction) is less than that of the upper surface 407*a*. In addition, the side surface 407*c* of the oxide conductive layer 407 is inclined with respect to the upper surface 405*a* of the first metal oxide layer 405. In other words, an angle 81 formed by the bottom surface 407*b* and the side surface 407*c* of the oxide conductive layer 407 in the oxide conductive layer 407 is greater than 90° and equal to or less than 170°.

A thickness t3 of the oxide conductive layer 407 may be about 400 Å to about 850 Å.

Because the oxide conductive layer 407 including the amorphous ITO may have pin holes, when the oxide conductive layer 407 has a smaller thickness, the first metal oxide layer 405 and/or the second metal layer 403 under (e.g., underneath) the oxide conductive layer 407 may be exposed and damaged by the pin holes during the manufacturing processes.

Figure 12:
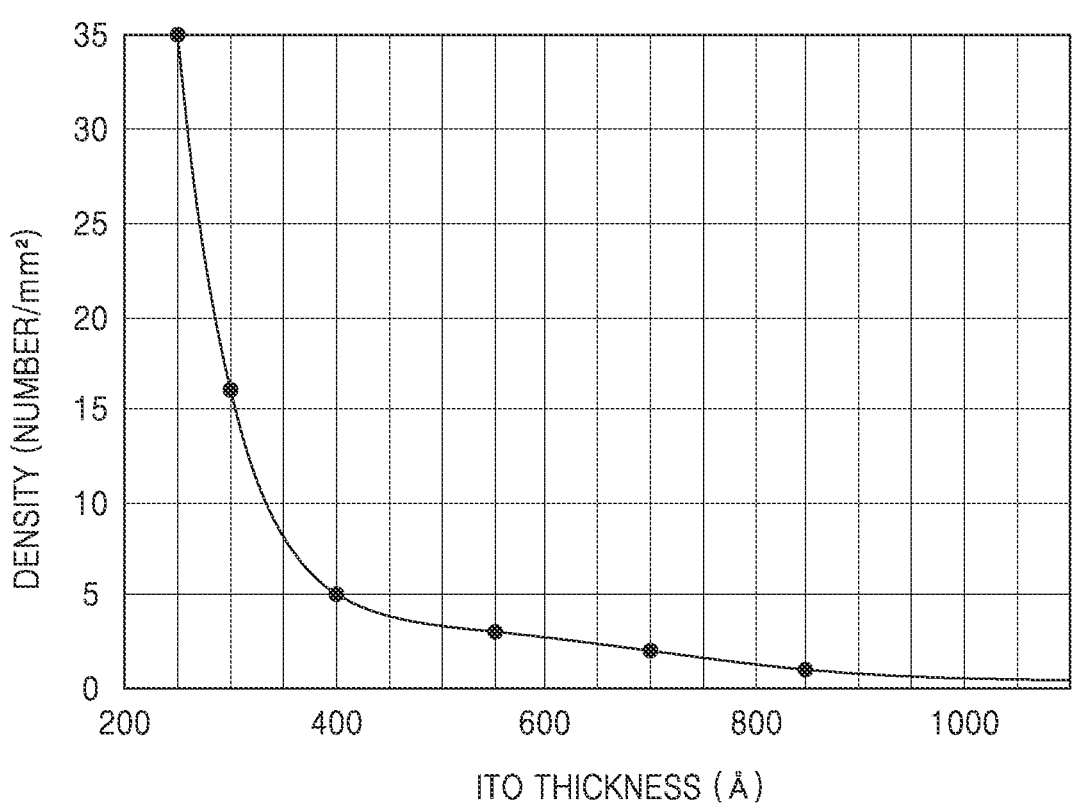
FIG. 12 is a graph showing a number of pin holes per unit area according to an ITO thickness.

FIG. 12 is a graph showing a number of pin holes per unit area according to an ITO thickness.

For example, FIG. 12 illustrates a graph showing a density of pin holes according to the thickness of the oxide conductive layer 407, when the oxide conductive layer 407 includes the amorphous ITO. In the graph, the transverse axis denotes a thickness of the oxide conductive layer 407 in units of Å, and the longitudinal axis denotes the number of pin holes per unit area (1 mm²). As shown in FIG. 12, when the thickness of the oxide conductive layer 407 is 800 Å, the number of pin holes per unit area is 1. When the thickness of the oxide conductive layer 407 is 700 Å, the number of pin holes per unit area is 2. When the thickness of the oxide conductive layer 407 is 550 Å, the number of pin holes per unit area is 3. When the thickness of the oxide conductive layer 407 is 400 Å, the number of pin holes per unit area is 5. In other words, the number of pin holes per unit area may be maintained or substantially maintained to be low. However, when the thickness of the oxide conductive layer 407 is 300 Å, the number of pin holes per unit area rapidly increases to 16, and when the thickness of the oxide conductive layer 407 is 250 Å, the number of pin holes per unit area further increases to 35. Therefore, the thickness t3 of the oxide conductive layer 407 may be 400 Å or greater in order to reduce the number of pinholes per unit area.

As used herein, the thickness t3 of the oxide conductive layer 407 denotes a thickness of a part of the oxide conductive layer 407 that is covered by the third insulating layer IL3, as shown in FIG. 11. In the pad 400, even when the thickness of the oxide conductive layer 407 is initially formed to be 400 Å or greater, part of the oxide conductive layer 407 may also be removed during the patterning process, in which the third insulating layer IL3 covering the pad 400 is formed and is partially removed, so that the third insulating layer IL3 has a first hole IL3-H overlapping with the pad 400, and the patterning process, in which the organic insulating layer OL located on the third insulating layer IL3 is formed and partially removed, so that the organic insulating layer OL may have a second hole OL-H overlapping with the first hole IL3-H of the third insulating layer IL3. Therefore, even when the oxide conductive layer 407 included in the pad 400 is initially formed to have the thickness of 400 Å or greater, the thickness of a part in the oxide conductive layer 407, which is not covered by the third insulating layer IL3, the organic insulating layer OL, and/or the like in the pad 400 is reduced in the final display apparatus, or in other words, may be 300 Å or greater.

In addition, when the thickness t3 of the oxide conductive layer 407 is increased, the oxide conductive layer 407 may not include the amorphous ITO, but may include crystalline ITO in the manufacturing processes. This is because when an ITO layer is formed and the thickness thereof is increased, a crystalline ITO layer is formed during the forming process. For example, when the thickness t3 of the oxide conductive layer 407 exceeds 850 Å, the crystalline ITO layer may be formed. Therefore, the thickness t3 of the oxide conductive layer 407 may be 850 Å or less.

The area of the bottom surface 403*b* of the second metal layer 403 (e.g., in the −z direction) is greater than that of the upper surface 403*a* thereof, and the side surface 403*c* of the second metal layer 403 may be inclined with respect to the bottom surface 403*b* of the second metal layer 403. Here, an angle 82 formed by the bottom surface 403*b* and the side surface 403*c* of the second metal layer 403 in the second metal layer 403 may be greater than or equal to about 30° and less than or equal to about 70°. When the angle 82 is less than 30, the area of the upper surface 403*a* of the second metal layer 403 (e.g., in the +z direction) is excessively reduced. Accordingly, a bonding force between the layers included in the pad 400 may be reduced, and isolation among the layers may occur. In addition, when the angle 82 exceeds 70°, the third insulating layer IL3 covering the pad 400 may not properly cover the edge of the first metal oxide layer 405 on the second metal layer 403.

The structure of the pad 400 in the cross-sectional view is described above, but the above description may be also applied to the source electrode 440 and the drain electrode 430 of the thin film transistor TFT, and the second electrode 420 of the storage capacitor Cst located at (e.g., in or on) the display area DA, and thus, redundant description thereof may not be repeated. As described above, the source electrode 440 and the drain electrode 430 of the thin film transistor, and the second electrode 420 of the storage capacitor Cst are concurrently (e.g., simultaneously) formed with the pad 400 by using the same material as that of the pad 400 during the manufacturing processes thereof. This will be also be applicable to the embodiments and modifications thereof that will be described in more detail below.

As a reference, the source electrode 440 and the drain electrode 430 of the thin film transistor TFT, and the second electrode 420 of the storage capacitor Cst located at (e.g., in or on) the display area DA are covered by the third insulating layer IL3, the organic insulating layer OL, and/or the like, and thus, upper portions of the source electrode 440 and the drain electrode 430 of the thin film transistor TFT, and the second electrode 420 of the storage capacitor Cst located at (e.g., in or on) the display area DA are not additionally etched during the manufacturing processes after being formed. Therefore, thicknesses of the sub-layers 437 and 427 that are the oxide conductive layers may be about 400 Å to about 850 Å.

The pad 400 as described above may overlap with the connecting lines 1100. In more detail, the pad 400 may be on the second portion 1102 of the connecting line 1100, and overlaps with the second portion 1102 of the connecting line 1100. In addition, the second insulating layer IL2 located under (e.g., underneath) the pad 400 and covering the second portion 1102 of the connecting line 1100 may have a contact hole CNT, so that the pad 400 may be electrically connected to the second portion 1102 of the connecting line 1100.

On the other hand, as described above, the third insulating layer IL3 covering the pad 400 includes the first hole IL3-H overlapping with the pad 400, and the organic insulating layer OL located on the third insulating layer IL3 may include the second hole OL-H overlapping with the first hole IL3-H of the third insulating layer IL3. As such, the upper surface of the pad 400 is exposed to the outside, and may be electrically connected to the integrated circuit element and/or the printed circuit board. Here, the second hole OL-H of the organic insulating layer OL may have a width that is different from that of the first hole IL3-H of the third insulating layer IL3. For example, as shown in FIG. 11, the width of the second hole OL-H may be less than that of the first hole IL3-H.

Figure 13:
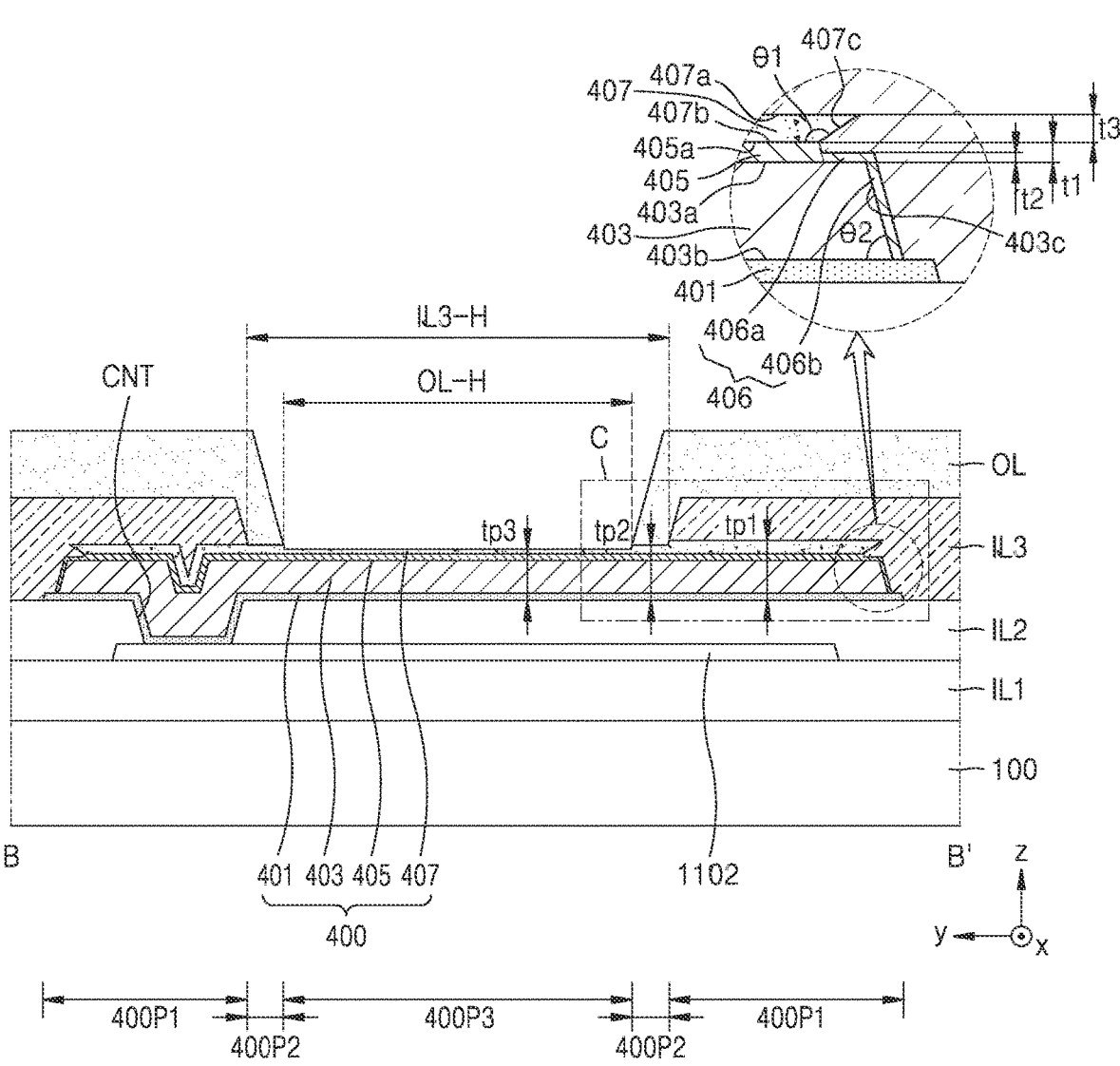
FIG. 13 is a cross-sectional view schematically showing a region of a display apparatus according to an embodiment.
Figure 14:
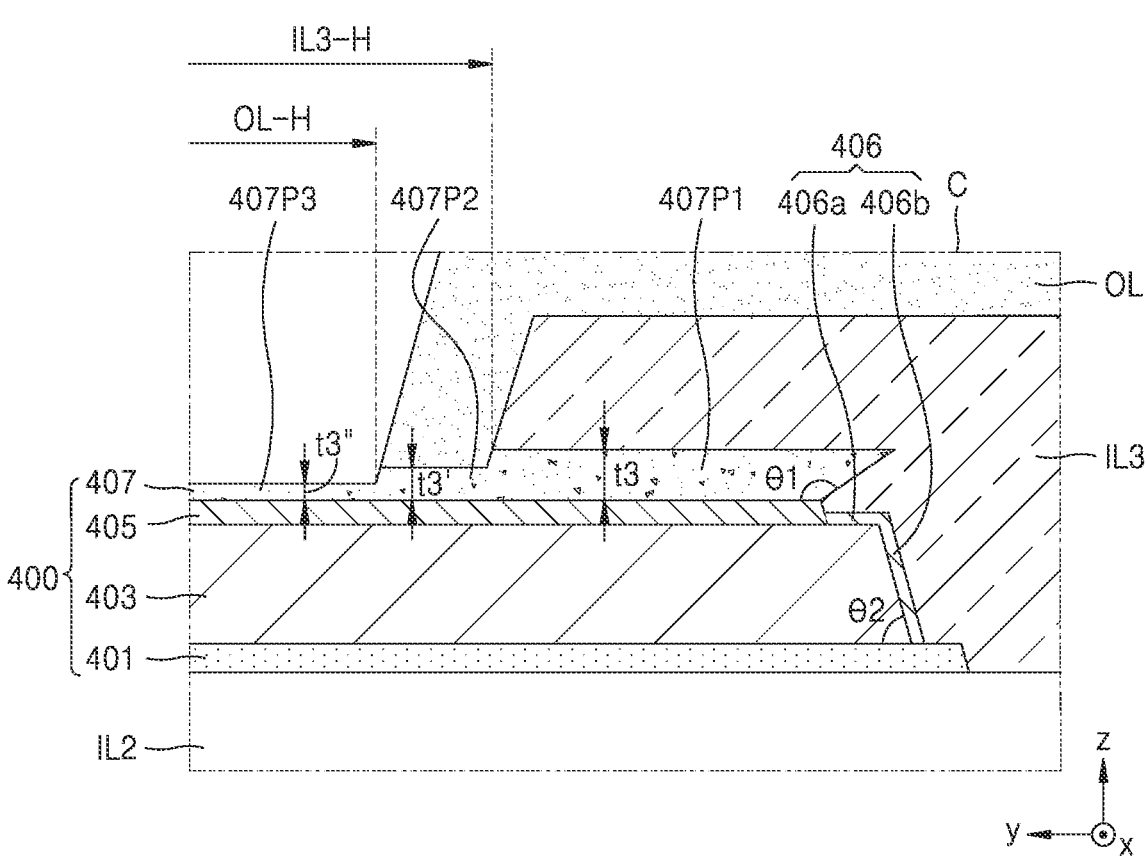
FIG. 14 is a cross-sectional view showing an enlarged view of the portion C in FIG. 13.

In FIG. 11, the entire thickness of the pad 400 is shown as being relatively uniform, but the present disclosure not limited thereto, for example, as shown in FIG. 13 and FIG. 14, which will be described in more detail below.

FIG. 13 is a cross-sectional view schematically showing a region of a display apparatus according to an embodiment, and FIG. 14 is a cross-sectional view showing an enlarged view of the portion C in FIG. 13. For example, in FIGS. 13 and 14, the thickness of the pad 400 may vary depending on sections (e.g., portions) thereof.

As shown in FIG. 13, the pad 400 may include first pad portions 400P1 that are edges of the pad 400, and a second pad portion that is closer to the center of the pad 400 than the first pad portions 400P1. The second pad portion may include 2-1st pad portions 400P2 and a 2-2nd pad portion 400P3. The 2-1st pad portions 400P2 may be closer to the first pad portions 400P1 than the 2-2nd pad portion 400P3. In other words, the 2-1st pad portions 400P2 may be located between the first pad portions 400P1 and the 2-2nd pad portion 400P3.

The first pad portions 400P1 of the pad 400 may overlap with the third insulating layer IL3 and the organic insulating layer OL. The 2-1st pad portions 400P2 may overlap with one of the third insulating layer IL3 or the organic insulating layer OL, for example, such as overlapping with the organic insulating layer OL as shown in FIGS. 13 and 14. The 2-2nd pad portion 400P3 may not overlap with both the third insulating layer IL3 and the organic insulating layer OL. In other words, the 2-2nd pad portion 400P3 may overlap with the first hole IL3-H and the second hole OL-H, the 2-1st pad portions 400P2 may overlap with one of the first hole IL3-H or the second hole OL-H (for example, such as the first hole IL3-H), and the first pad portions 400P1 may not overlap with both the first hole IL3-H and the second hole OL-H.

A thickness tp1 of the first pad portions 400P1 may be greater than a thickness tp2 of the 2-1st pad portions 400P2, and the thickness tp2 of the 2-1st pad portions 400P2 may be greater than a thickness tp3 of the 2-2nd pad portion 400P3. The thicknesses of the portions of the pad 400 may be determined according to the thickness of the oxide conductive layer 407.

As shown in FIG. 14, the oxide conductive layer 407 that is arranged at the uppermost layer of the pad 400 may have the thickness that varies depending on regions thereof. The oxide conductive layer 407 may include a first oxide conductive layer portion 407P1, a 2-1st oxide conductive layer portion 407P2, and a 2-2nd oxide conductive layer portion 407P3, which correspond to the first pad portions 400P1, the 2-1st pad portions 400P2, and the 2-2nd pad portion 400P3, respectively, of the pad 400.

The first oxide conductive layer portion 407P1 of the oxide conductive layer 407 may overlap with the third insulating layer IL3 and the organic insulating layer OL. The 2-1st oxide conductive layer portion 407P2 of the oxide conductive layer 407 may overlap with one of the third insulating layer IL3 or the organic insulating layer OL, for example, such as the organic insulating layer OL. The 2-2nd oxide conductive layer portion 407P3 of the oxide conductive layer 407 may not overlap with both the third insulating layer IL3 and the organic insulating layer OL. In other words, the 2-2nd oxide conductive layer portion 407P3 of the oxide conductive layer 407 overlap with the first hole IL3-H and the second hole OL-H concurrently (e.g., simultaneously), the 2-1st oxide conductive layer portion 407P2 of the oxide conductive layer 407 overlaps with one of the first hole IL3-H or the second hole OL-H (for example, the first hole IL3-H), and the first oxide conductive layer portion 407P1 of the oxide conductive layer 407 may not overlap with both the first hole IL3-H and the second hole OL-H.

The thickness t3 of the first oxide conductive layer portion 407P1 of the oxide conductive layer 407 may be equal to the thickness t3 described above with reference to FIG. 11. In other words, the thickness t3 of the first oxide conductive layer portion 407P1 of the oxide conductive layer 407 may be about 400 Å to about 850 Å. On the other hand, a thickness t3' of the 2-1st oxide conductive layer portion 407P2 of the oxide conductive layer 407 may be less than the thickness t3 of the first oxide conductive layer portion 407P1. The first hole IL3-H of the third insulating layer IL3 may be formed through the etching, and in the etching process for forming the first hole IL3-H, the oxide conductive layer 407 is partially etched (e.g., is partially lost), and thus, the thickness t3' of the 2-1st oxide conductive layer portion 407P2 may be less than the thickness t3 of the first oxide conductive layer portion 407P1.

A thickness t3'' of the 2-2nd oxide conductive layer portion 407P3 of the oxide conductive layer 407 may be less than the thickness t3' of the 2-1st oxide conductive layer portion 407P2 of the oxide conductive layer 407. The 2-2nd oxide conductive layer portion 407P3 of the oxide conductive layer 407 may be primarily etched (e.g., primarily lost) during the etching process for forming the first hole IL3-H as described above, and afterwards, may be secondarily etched (e.g., secondarily lost) during the etching process for forming the pixel electrode 510 and/or the like of the display apparatus. Therefore, the thickness t3" of the 2-2nd oxide conductive layer portion 407P3 may be less than both the thickness t3' of the 2-1st oxide conductive layer portion 407P2 and the thickness t3 of the first oxide conductive layer portion 407P1. Accordingly, the thickness t3" of the 2-2nd oxide conductive layer portion 407P3 of the oxide conductive layer 407 may be about 300 Å to about 850 Å.

According to one or more embodiments of the present disclosure, the display apparatus having a low defective rate during the manufacturing processes thereof, and the method of manufacturing the display apparatus may be implemented. However, the aspects and features of the present disclosure are not limited thereto.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate comprising a display area, and a peripheral area outside the display area;
   a display element at the display area; and
   a pad at the peripheral area, the pad comprising:
      a first metal layer;
      a second metal layer on the first metal layer;
      a first metal oxide layer on the second metal layer, and in surface-contact with the second metal layer; and
      an oxide conductive layer on the first metal oxide layer, and in surface-contact with the first metal oxide layer,
   wherein the first metal oxide layer comprises an oxide of a metal included in the second metal layer.

2. The display apparatus of claim 1, wherein the oxide conductive layer comprises indium tin oxide (ITO).

3. The display apparatus of claim 1, wherein the oxide conductive layer comprises amorphous ITO.

4. The display apparatus of claim 1, wherein the first metal layer comprises titanium.

5. The display apparatus of claim 1, wherein the oxide conductive layer has a thickness of about 400 Å to about 850 Å.

6. The display apparatus of claim 1, wherein an area of a bottom surface of the second metal layer is greater than an area of an upper surface of the second metal layer, and a side surface of the second metal layer is inclined with respect to the bottom surface of the second metal layer.

7. The display apparatus of claim 6, wherein an angle between the bottom surface and the side surface of the second metal layer is about 30° to about 70°.

8. The display apparatus of claim 1, further comprising a thin film transistor at the display area, and electrically connected to the display element, the thin film transistor comprising an electrode having a layered structure that is the same as a layered structure of the pad.

9. The display apparatus of claim 1, wherein the display apparatus is one of a smartphone, a tablet, a laptop computer, a television, or a billboard.

10. The display apparatus of claim 1, wherein a side surface of the oxide conductive layer is inclined with respect to an upper surface of the first metal oxide layer, and comprises a portion that faces toward the upper surface of the first metal oxide layer while being spaced from the upper surface of the first metal oxide layer.

11. A display apparatus comprising:
   a substrate comprising a display area, and a peripheral area outside the display area;
   a display element at the display area; and
   a pad at the peripheral area, the pad comprising:
      a first metal layer;
      a second metal layer on the first metal layer;
      a first metal oxide layer on the second metal layer, and in surface-contact with the second metal layer; and
      an oxide conductive layer on the first metal oxide layer, and in surface-contact with the first metal oxide layer,
   wherein a bottom surface of the oxide conductive layer facing the first metal oxide layer has an area that is less than an area of an upper surface of the oxide conductive layer, and
   wherein a side surface of the oxide conductive layer is inclined with respect to an upper surface of the first metal oxide layer.

12. The display apparatus of claim 11, wherein an area of the upper surface of the first metal oxide layer is equal to the area of the bottom surface of the oxide conductive layer.

13. The display apparatus of claim 12, further comprising a second metal oxide layer on the second metal layer and located outside the first metal oxide layer.

14. The display apparatus of claim 13, wherein the first metal oxide layer and the second metal oxide layer are integrally formed as a single body.

15. The display apparatus of claim 13, wherein the first metal oxide layer has a thickness that is greater than a thickness of the second metal oxide layer.

16. The display apparatus of claim 13, wherein the first metal oxide layer and the second metal oxide layer comprise a same material as each other.

17. The display apparatus of claim 13, wherein the first metal oxide layer and the second metal oxide layer comprise an oxide of a metal included in the second metal layer.

18. The display apparatus of claim 13, wherein the second metal layer comprises copper, and the first metal oxide layer and the second metal oxide layer comprise copper oxide.

19. The display apparatus of claim 11, wherein the area of the upper surface of the oxide conductive layer is equal to or less than an area of an upper surface of the second metal layer.

20. The display apparatus of claim 11, wherein an angle between the bottom surface and the side surface of the oxide conductive layer is larger than 90° and less than or equal to 170°.

* * * * *